United States Patent
Cho et al.

(10) Patent No.: US 10,471,424 B2
(45) Date of Patent: Nov. 12, 2019

(54) MICROFLUIDIC CIRCUIT ELEMENT COMPRISING MICROFLUIDIC CHANNEL WITH NANO INTERSTICES AND FABRICATION METHOD THEREOF

(71) Applicant: INCYTO CO., LTD., Cheonan-si, Chungcheongnam-da (KR)

(72) Inventors: Sin Kil Cho, Seoul (KR); Seok Chung, Cambridge, MA (US)

(73) Assignee: INCYTO CO., LTD., Cheonan-si (KR)

(*) Notice: Subject to any disclaimer, the term of this patent is extended or adjusted under 35 U.S.C. 154(b) by 0 days.

(21) Appl. No.: 15/988,503

(22) Filed: May 24, 2018

(65) Prior Publication Data

US 2018/0264469 A1 Sep. 20, 2018

Related U.S. Application Data

(62) Division of application No. 14/921,042, filed on Oct. 23, 2015, now Pat. No. 10,005,082, which is a
(Continued)

(30) Foreign Application Priority Data

Apr. 11, 2008 (KR) .................. 10-2008-0033757

(51) Int. Cl.
*B01L 3/00* (2006.01)
*B29C 65/48* (2006.01)
(Continued)

(52) U.S. Cl.
CPC ........ *B01L 3/502707* (2013.01); *B29C 65/08* (2013.01); *B29C 65/4895* (2013.01);
(Continued)

(58) Field of Classification Search
CPC .................. B01J 2219/00833; B01J 19/0093
(Continued)

(56) References Cited

U.S. PATENT DOCUMENTS

| | | | |
|---|---|---|---|
| 5,587,128 A | 12/1996 | Wilding et al. | |
| 5,880,071 A | 3/1999 | Parce et al. | |

(Continued)

FOREIGN PATENT DOCUMENTS

| | | |
|---|---|---|
| JP | 2004-283828 A | 10/2004 |
| JP | 2005-177754 A | 7/2005 |

(Continued)

OTHER PUBLICATIONS

Debashis Dutta, et al.; "Effect of channel geometry on solute dispersion in pressure-driven microfluidic systems"; Microfluidics and Nanofluidics (2006) 2: 275-290.

*Primary Examiner* — Natalia Levkovich
(74) *Attorney, Agent, or Firm* — Sughrue Mion, PLLC

(57) ABSTRACT

A microfluidic circuit element comprising a microfluidic main channel and nano interstices is disclosed. The nano interstices are formed at both sides of the main channel and are in fluid communication with the main channel. The nano interstices have a height less than that of the main channel, gives more driving force of the microfluidic channel and provides stable flow of a fluid. The microfluidic circuit element may be made from a plastic material having a contact angle of 90 degrees or less. The microfluidic circuit element is particularly useful when filling a liquid sample to the channel which is empty or filled with air and shows greatly improved a storage stability.

2 Claims, 16 Drawing Sheets

Related U.S. Application Data division of application No. 12/936,839, filed as application No. PCT/KR2009/001853 on Apr. 10, 2009, now abandoned.

(51) Int. Cl.

| | |
|---|---|
| *B29C 65/08* | (2006.01) |
| *B29C 65/50* | (2006.01) |
| *B29C 65/78* | (2006.01) |
| *B29C 65/00* | (2006.01) |
| *B81C 1/00* | (2006.01) |
| *B29C 65/82* | (2006.01) |
| *B29L 31/00* | (2006.01) |
| *B29C 65/16* | (2006.01) |
| *B29C 65/54* | (2006.01) |
| *B29C 65/02* | (2006.01) |
| *B29K 25/00* | (2006.01) |

(52) U.S. Cl.
CPC ........ *B29C 65/5057* (2013.01); *B29C 65/782* (2013.01); *B29C 65/7826* (2013.01); *B29C 65/7829* (2013.01); *B29C 65/8253* (2013.01); *B29C 66/1122* (2013.01); *B29C 66/3022* (2013.01); *B29C 66/53461* (2013.01); *B29C 66/83221* (2013.01); *B29C 66/929* (2013.01); *B81C 1/00119* (2013.01); *B01L 2200/0605* (2013.01); *B01L 2400/0406* (2013.01); *B29C 65/02* (2013.01); *B29C 65/16* (2013.01); *B29C 65/48* (2013.01); *B29C 65/542* (2013.01); *B29C 66/71* (2013.01); *B29K 2025/06* (2013.01); *B29L 2031/756* (2013.01); *B81C 2203/037* (2013.01)

(58) Field of Classification Search
USPC .................................. 422/502, 503; 156/295
See application file for complete search history.

(56) References Cited

U.S. PATENT DOCUMENTS

| | | | |
|---|---|---|---|
| 7,037,400 | B1 | 5/2006 | Shaw et al. |
| 7,171,975 | B2 | 2/2007 | Moon et al. |
| 2002/0187074 | A1* | 12/2002 | O'Connor ............. B01F 5/0682 |
| | | | 422/82.05 |
| 2003/0068646 | A1 | 4/2003 | Singh et al. |
| 2005/0064465 | A1 | 3/2005 | Dettloff et al. |
| 2005/0169778 | A1 | 8/2005 | Blankenstein et al. |
| 2006/0062696 | A1 | 3/2006 | Chow et al. |
| 2007/0151616 | A1 | 7/2007 | Znamensky et al. |
| 2008/0000833 | A1 | 1/2008 | Peters et al. |
| 2008/0008628 | A1 | 1/2008 | Park et al. |

FOREIGN PATENT DOCUMENTS

| | | |
|---|---|---|
| JP | 2006-512545 A | 4/2006 |
| JP | 2006-142198 A | 6/2006 |
| JP | 2006-159006 A | 6/2006 |
| JP | 2006-346626 A | 12/2006 |
| KR | 10-2005-0037603 A | 4/2005 |
| KR | 10-0790881 B1 | 1/2008 |

* cited by examiner

White marks: After 1 day of fabrication
Black marks: After 1 year of fabrication White marks: After 1 day of fabrication
Black marks: After 1 year of fabrication

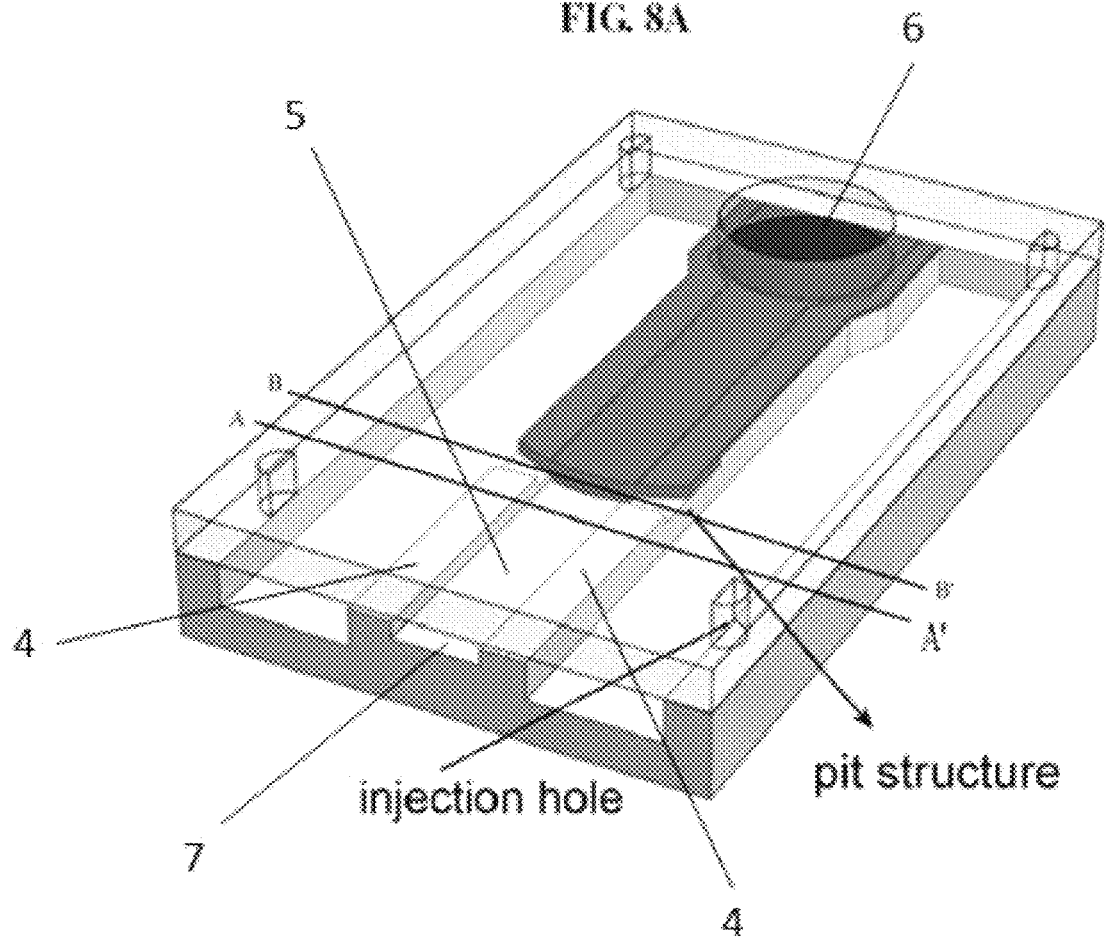

MICROFLUIDIC CIRCUIT ELEMENT COMPRISING MICROFLUIDIC CHANNEL WITH NANO INTERSTICES AND FABRICATION METHOD THEREOF

CROSS REFERENCE TO RELATED APPLICATIONS

This application is a Rule 53(b) Divisional Application of U.S. application Ser. No. 14/921,042 filed Oct. 23, 2015, which is a continuation-in-part of application Ser. No. 12/936,839 filed Oct. 7, 2010, which is a National Stage of International Application No. PCT/KR2009/001853 filed Apr. 10, 2009, claiming priority based on Korean Patent Application No. 10-2008-0033757 filed Apr. 11, 2008, the contents of all of which are incorporated herein by reference in their entirety.

FIELD OF THE INVENTION

The present invention relates to a microfluidic circuit element having a microfluidic channel for stabilizing the flow of a fluid and a method for fabricating the same.

BACKGROUND OF THE INVENTION

Microfluidics, which concerns the control of the flow and transfer of a very small amount of fluid, is essential for driving an apparatus for diagnosing and analyzing a sample, which may be executed using various driving methods such as a pressure-driven method using an applied pressure to a fluid injection portion; an electrophoretic method using an applied voltage across a microchannel; an electroosmotic method; and a capillary flow method using capillary force.

A typical example of a microfluidic device driven using a pressure-driven method is illustrated in U.S. Pat. No. 6,296,020, in which the cross-sectional area of a channel and the hydrophobicity of the channel are controlled with a passive valve installed in a hydrophobic fluidic circuit device. In addition, U.S. Pat. No. 6,637,463 discloses a microfluidic device in which channels having pressure gradients have been designed so that a fluid is uniformly distributed through the channels.

The capillary flow method, in particular, which uses capillary force spontaneously occurring in microchannels is advantageous because a very small amount of a fluid moves spontaneously and instantly along specific channels without the use of an additional driving means. Hence, extensive studies of microfluidic systems using such capillary flow method have been recently conducted. For example, U.S. Pat. No. 6,271,040 discloses a diagnostic biochip in which a sample is transferred using only the naturally-occurring capillary flow in microchannels without the use of a porous material, and the sample transferred in such a way was allowed to react with the biochips to detect a specific component in the sample. Also, U.S. Pat. No. 6,113,855 discloses a diagnostic apparatus in which hexagonal micropillars are appropriately arranged to generate capillary force for transferring a sample through the space between the pillars.

In order to achieve a satisfactory flow of a fluid in the conventional microfluidic device using the capillary flow method, the surface wettability of the capillary wall must be good. In case of a conventional plastic microfluidic device, such surface wettability of the plastic is unacceptably low, and to improve the poor surface wettability, a treatment, e.g., corona, surface coating and plasma treatments, has been conventionally used. For example, a method of roughening the inner surface of a microfluidic channel to enhance a fluid flow rate has been reported in WO 2007/075287.

However, the above methods for improving the wettability makes it difficult to achieve mass production of microfluidic devices, and they may also cause processing problems such as a need for the use of additional devices to carry out additional tasks. Further, because the effects of these treatment methods may deteriorate over a large period of use, it is difficult to maintain a constant, stable flow of a fluid.

SUMMARY OF THE INVENTION

Accordingly, it is an object of the present invention to provide a microfluidic circuit element, which enables a fluid to flow only by the action of capillary force without an additional need for surface treatment such as chemical treatment or plasma treatment, is capable of maintaining the flow of a fluid uniform over a long period of time, and is easily fabricated without limitation of material. Another object of the present invention is to provide a method for fabricating said microfluidic circuit element.

In accordance with one aspect of the present invention, there is provided a microfluidic circuit element comprising a first substrate and a second substrate in a laminate form, the first substrate having a groove for defining a microfluidic channel which is formed on the side facing the second substrate and has an inlet and an outlet for a sample to flow through said channel, wherein the microfluidic channel has nano interstices formed at both sides thereof, the height of the nano interstices being less than that of the center of the microfluidic channel.

In accordance with another aspect of the present invention, there is provided a method for fabricating a microfluidic circuit element, comprising joining a first substrate and a second substrate such that a groove is formed therebetween to serve as a microfluidic channel which has an inlet and an outlet for a sample to flow therethrough and nano interstices having a height which is less than that of the center of the microfluidic channel formed at both sides of the microfluidic channel.

BRIEF DESCRIPTION OF THE DRAWINGS

The above and other objects and features of the present invention will become apparent from the following description of the invention, when taken in conjunction with the accompanying drawings, which respectively show:

FIG. 8A is a schematic view of a channel having nano interstices according to another embodiment of the invention, wherein the nano interstices have a portion ("pit structure") of which a height is greater than that of the nano interstices.

DETAILED DESCRIPTION OF THE INVENTION

The microfluidic circuit element according to an embodiment of the present invention comprises a first substrate and a second substrate on the first substrate, the first substrate having a groove for defining a microfluidic channel which is formed on the side facing the second substrate and has an inlet and an outlet for a sample to flow through said channel, wherein the microfluidic channel has nano interstices formed at both sides thereof, the height of the nano interstices being less than that of the center of the microfluidic channel.

Figure 2A:
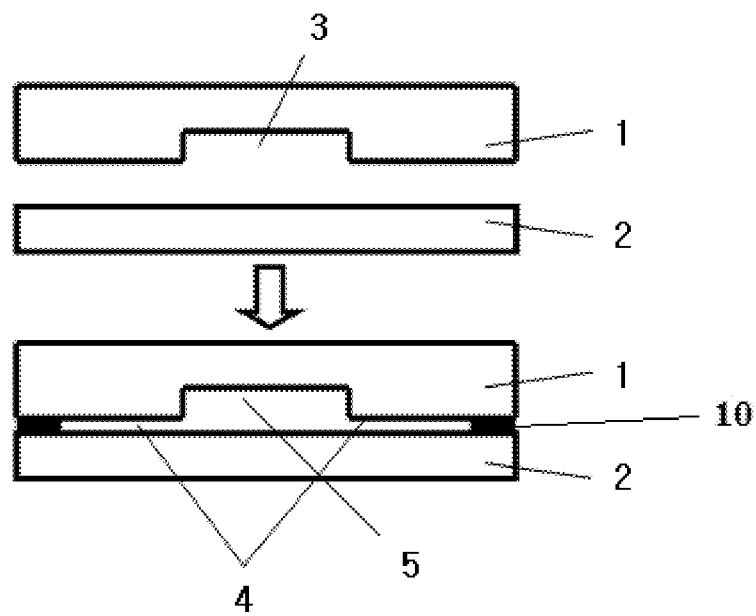
FIG. 2A: a schematic view of the cross-section of a microfluidic channel according to an embodiment of the present invention and a process of forming nano interstices joined by using a solvent, applying heat, a pressure or a laser beam according to the present invention.

The size of the main channel is not limited, but, the height of the main channel may be in the range of 5 μm to 2 mm, and the width of the main channel may be in the range of 100 μm to 20 mm. In an exemplary embodiment, the aspect ratio, i.e., the ratio of the width of the main channel to the height of the main channel may be 10 or greater, or 20 or greater. In an exemplary embodiment, the aspect ratio is about 10-2000. The shape of the main channel may be of any kind. For example, the cross-section of the microfluidic channel may have any shape as shown in FIG. 2H, including a rectangular or other shape, e.g., a circular shape and a semicircular shape, provided that it is equipped with the above-mentioned nano interstices to realize the effects brought thereby.

The each of the nano interstices are symmetric to each other.

The flow of a microfluid through the microfluidic channel may be driven by using pressure application, electrophoresis procedure, or capillary force. The use of capillary force is preferred because of the reasons that a fluid may be easily loaded or transferred, and a simplified device or system may be adopted without the need for external applied energy.

To maintain a stable flow of a sample fluid, the surface wettability is particularly important. For the improvement of the surface wettability, the cross-section of the nano interstices formed according to the present invention may be of a rectangular shape having a high aspect ratio, although, the present invention is not limited thereto: other shapes including irregular shapes may also be employed (see FIGS. 2D to 2G.) In an exemplary embodiment, the height of the nano interstices may be less than ⅕ of the height of the main channel and may be in the range of 100 nm to 5 μm, which facilitates the capillary flow of the fluid through the nano interstices to stabilize the overall flow through the channel. For example, the nano interstices may have a height of 1 μm or less, 2 μm or less, or 5 μm or less when the main channel has a height of 5 μm, 10 μm, or 25 μm, respectively.

The width of the nano interstices may be in a range from 100 μm to 3 mm.

The material for manufacturing microfluidic channel of the present invention may be any of those which enable the manufacture of the microfluidic system, and examples thereof are a silicon wafer, glass, pyrex, PDMS (polydimethylsiloxane), plastic, e.g., acryls, PMMA, PC, and others. A plastic having a static contact angle of 90 degrees or less may be used to fabricate the microfluidic channel element according to the embodiments of the invention. In an exemplary embodiment, the surface of the plastic may have a static contact angle between 40 to 90 degrees. When the contact angle is less than 40 degrees (i.e., when the material is hydrophilic), water is easily filled in the main channel regardless of the presence of nano interstices.

The microfluidic channel according to embodiments of the invention works with a surprisingly high efficiency when a fluid sample is introduced into an empty channel.

The present invention also provides a method for fabricating the microfluidic circuit element having nano interstices. Referring to FIG. 1B, the fabrication method comprises joining a first substrate (1) and a second substrate (2) such that a groove (3) is formed therebetween to serve as a microfluidic channel (5) which is provided with an inlet (6) and an outlet (7) for a sample to flow therethrough and nano interstices (4) having a height which is less than that of the center of the microfluidic channel, said interstices formed at both sides of the microfluidic channel.

For the formation of the microfluidic channel, the first and second substrates (1 and 2) are washed, or may be subjected to any of the known surface treatment methods to make the surface of the channel hydrophilic. Before joining of the first and second substrates (1 and 2), a chemical treatment or an oxygen plasma treatment may be performed to increase the surface wettability of the surface of the channel and the interstices. In case an oxygen plasma treatment is performed, the surface is made hydrophilic by reducing the surface contact angle, but the effect of such treatment lasts only about three or four months.

Examples of the method for fabricating the microfluidic channel include silicon microprocessing, glass microprocessing, plastic microprocessing, and PDMS microprocessing. Among them, the glass microprocessing is preferable in terms of stabilizing the capillary flow in the channel because glass has a small contact angle with an aqueous fluid.

The first and second substrates (1 and 2) are then disposed to face each other, and joined together using e.g., the solvent method to form the nano interstices (4). Nano interstices (4) of a preferred dimension may be formed by joining the first and second substrates (1 and 2) by applying an appropriate pressure thereto for a predetermined period of time, which can be conducted by any of those skilled in the art. As mentioned above, the height of the nano interstices (4) is may be the range of 100 nm to 5 µm. The width of the nano interstices (4) may be in a range from 100 µm to 3 mm.

Also, the shape of the nano interstices (4) is not particularly limited, and any of those illustrated in FIGS. 2D to 2G may be employed.

To form the nano interstices (4), the first and second substrates are joined using at least one joining process selected from the group consisting of processes using a solvent, ultrasonic radiation, an adhesive, a tape, heat, a laser beam, and pressure application.

Examples of the joining process include processes using an adhesive, a solvent, heat, pressure application and a laser beam, to fuse only the peripheral regions of the two substrates so that the unjoined regions thereof form the nano interstices (4) (see FIGS. 1A, 1B, 2D, 2E, 2F, 2G, 3A). Also employables for the same purpose are a process of joining only preformed protruded portions of a substrate to another substrate using ultrasonic radiation such that the inner region of the joined region of the joined substrate serves as the nano interstices (4) (see FIG. 2B), and a process of joining only a predetermined region of the two substrates using an adhesive or a tape such that the inner region of the substrates other than the joined region can be used as the nano interstices (4) (see FIGS. 2A, 2C.). In this embodiment, the height of the nano interstices (4) are the thickness of the adhesive or the tape which is used to bond the upper and lower substrate together.

Figure 3A:
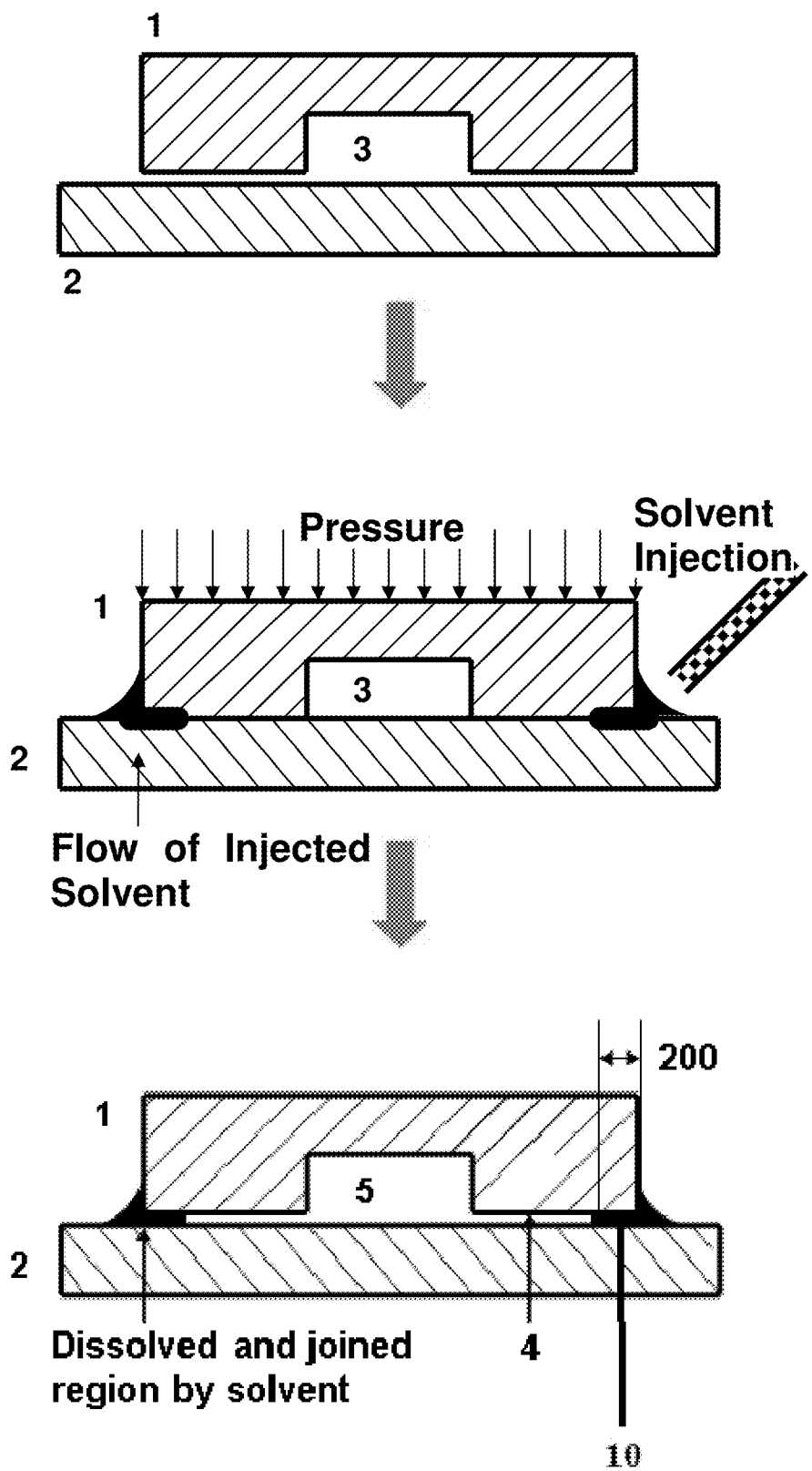
FIG. 3A: a process of forming a channel having nano interstices joined using solvent according to the present invention.

As depicted in FIG. 3A, a first and a second substrate, of which one has a microchannel pattern, are disposed to face each other, and then injecting the solvent around the periphery of the joining section of the substrates so that the injected solvent dissolves only a predetermined part of the peripheral regions of the first and second substrates, and the inner part thereof left undissolved serves as the nano interstices. Thus, in this embodiment, the height of the nano interstices is the same as the thickness of the bonding layer.

Alternatively, the inventive joining process may be performed by disposing the first and second substrates to face each other and then joining only peripheral regions of the substrates using heat or a laser, instead of joining the entire contact region there between so that the unjoined region of the interface between the first and second substrates is used as the nano interstices.

According to the inventive joining process, the microfluidic channel having nano interstices can be formed using a single continuous process and the height of the microfluidic channel can be precisely controlled by controlling the amount of the adhesive or a solvent employed, the pressure applied to join the upper and lower substrates, and/or the duration of pressing the substrates. E.g., FIG. 3A, and FIG. 7.

In the present invention, the nano interstices may be formed during or after joining of the first and second substrates, or alternatively, it may be preformed in the first or second substrate before joining of the first and second substrates, wherein the shape of the nano interstices may be easily adjusted depending on the structure of the microfluidic channel.

Figure 1A:
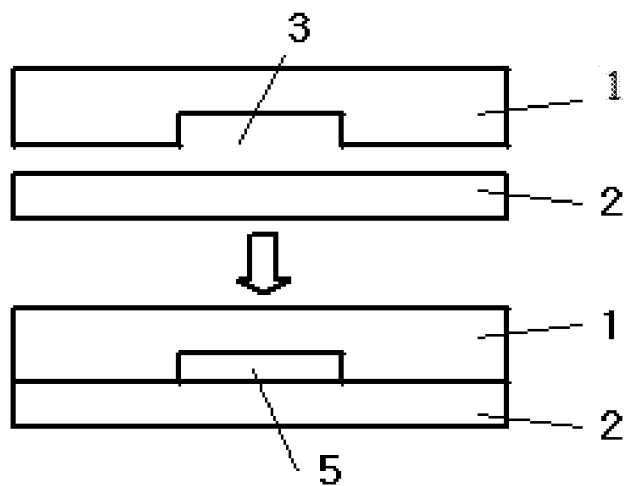
FIG. 1A: a schematic view of a conventional microfluidic channel.
Figure 1B:
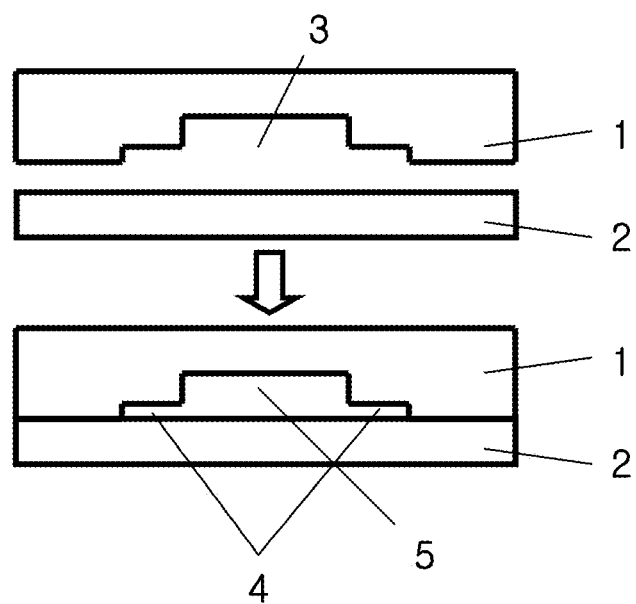
FIG. 1B: a schematic view of the cross-section viewed along the dotted line A-A' of FIG. 6 of a microfluidic channel according to an embodiment of the present invention and a process of forming nano interstices joined by using a solvent, applying heat, a pressure or a laser beam.

In one embodiment, as mentioned above, the nano interstices can be formed without the need to add additional steps to the conventional preparation of the microfluidic channel (see FIG. 1A.). The nano interstices of the present invention may be provided by slightly changing the conventional preparation process.

Figure 7:
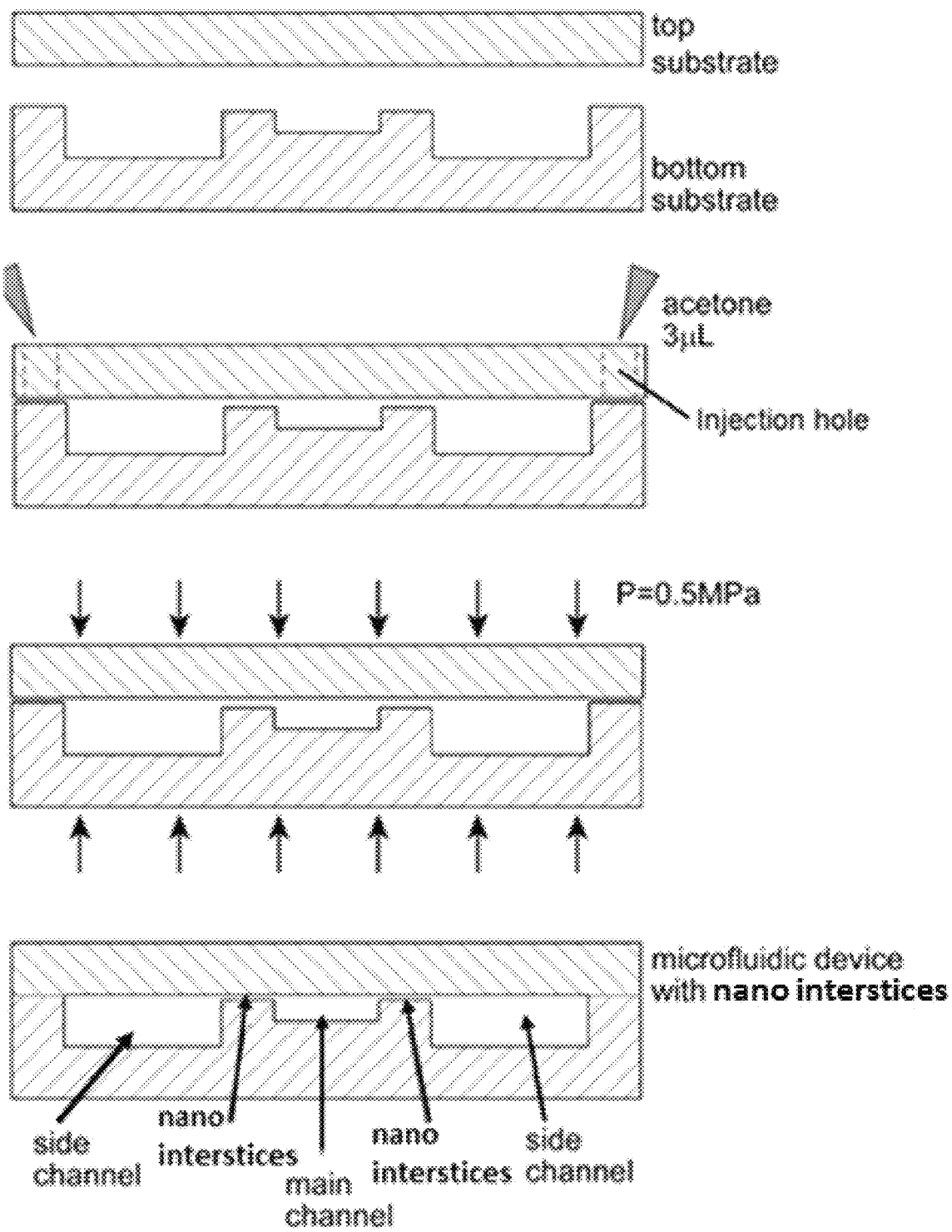
FIG. 7: a process of forming a channel having nano interstices using a solvent according to an embodiment of the invention.
Figure 8B:
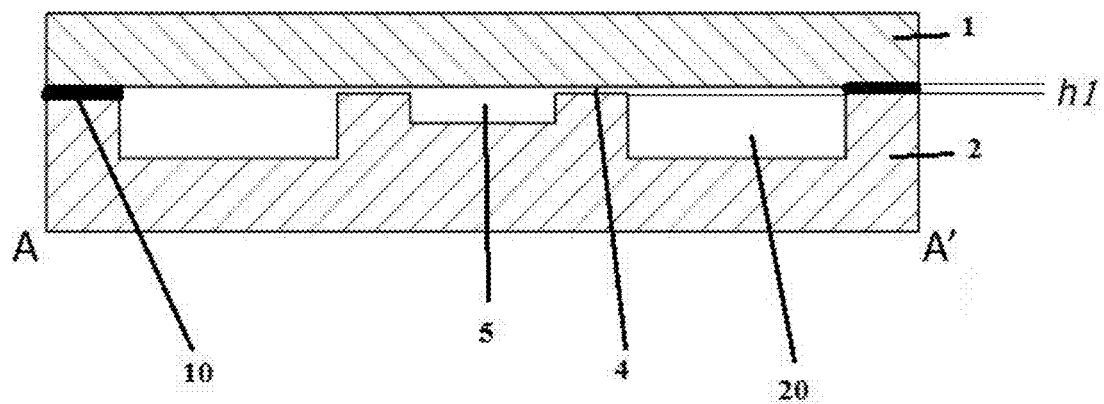
FIG. 8B and FIG. 8C are cross sectional views taken along the A-A' and B-B' lines, respectively.

As shown in FIG. 3A and FIG. 7, a substrate which is formed with only main channel (FIG. 3A), or a main channel and side channels (FIG. 7) is joined to the other substrate by applying a solvent such as acetone only to a certain area, in particular to peripheral area(s) and applying a controlled amount of pressure to join the substrates, leaving a space between the two substrates. The resulting micro channel structure has a first substrate (1), a second substrate (2), a bonding layer (10) disposed between the first substrate and the second substrate, a microchannel (5) (FIG. 3A) and two side channels (20) (FIG. 8C alone), and spaces 4 between the first and the second substrates. These spaces (4) can serve as nano interstices. In this case, the height of the nano interstices (4 in FIG. 3A and FIG. 8B) of the obtained microchannel is the same as the thickness of the bonding layer (10 in FIGS. 3A and 8B) formed between the substrates.

The solvent may be injected through injection holes provided in one of the substrates. The injection holes may be formed on the corners of the substrate. However, the injection holes may be formed in other peripheral regions of the substrate as long as the bonding layer formed from the solvent and pressure application covers only peripheral areas of the substrates, leaving spaces formed between the surfaces of the substrates.

Figure 8C:
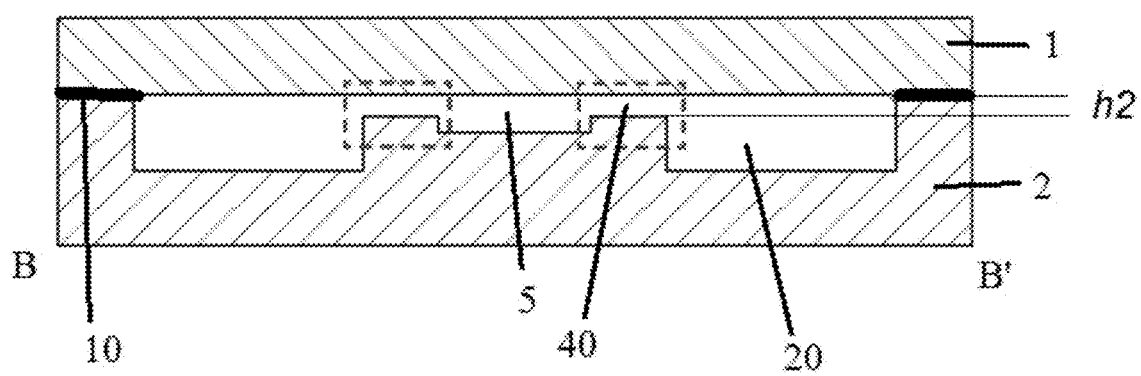

As shown in FIG. 8A and FIG. 8C, the nano interstices of the microfluidic channel may have a pit structure where the height of the space between the substrates (h2 in FIG. 8C) is greater than the height of the nano interstices (h1 in FIG. 8C). The inventors found that the insertion of pits in the nano interstices improved the stability of the nano interstices-driven microflow by inhibiting bubble generation in the main channel and facilitating the recovery of symmetry at the air-liquid interface. This structure can improve upon commercial detection applications of microfluidic devices by offering a stable and robust flow with improved signal accuracy.

The microfluidic channel according to an embodiment of the invention may have a center main channel and two side nano interstices along its longitudinal direction and further two side channels which are in fluid communication with the neighboring respective nano interstices. See, FIG. 7, FIG. 8A, and FIG. 8B.

The nano interstices of the microfluidic channel may be provided with a pit structure which has a greater height (or depth) than the height (depth) of the remainder of the nano interstices. The pit is provided in a symmetric location of the nano interstices with respect to the center main microfluidic channel. E.g., FIGS. 8A and 8C.

The inventors further found that the inventive microfluidic channel element does not require hydrophilic surface treatments. If preferred, the channel may subjected to a hydrophilic surface treatment. According to another exemplary embodiment, there is provided a method of stabilizing a liquid filling into a microfluidic device using the inventive.

The method includes a step of filling a sample liquid into the empty microfluidic channel from the inlet to the outlet; wherein the position of air-liquid interface, which is formed by the flowing of the sample liquid, in the nano interstice precedes the air-liquid interface in the main microfluidic channel; and wherein the liquid filling is not generated by pressure and electrokinetic force, but dragged by pre-filled liquid in the nano interstices.

Figure 6:
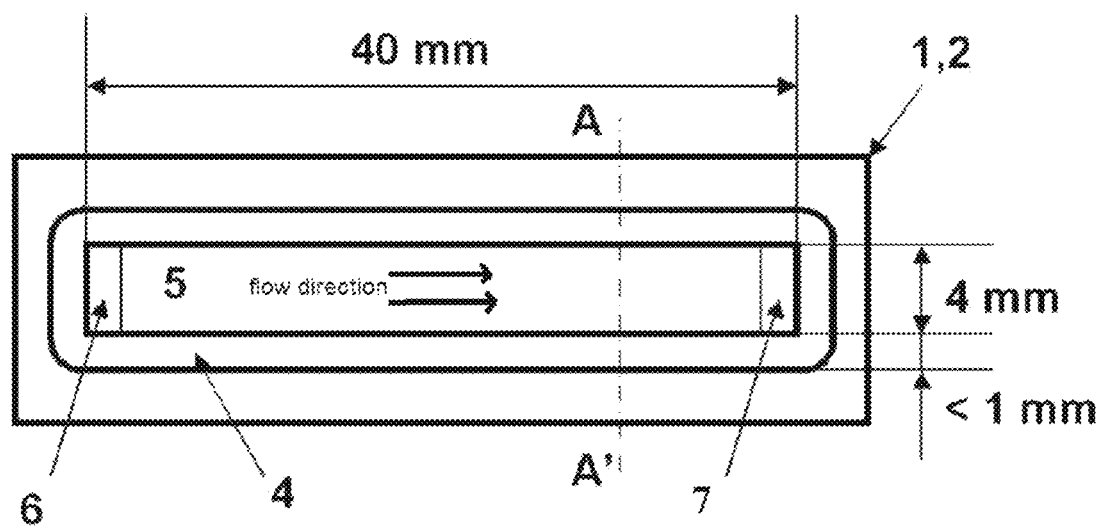
FIG. 6: an example of the microfluidic channel according to an embodiment of the present invention and a photograph thereof.

FIG. 6 shows the microfluidic circuit element having an inlet (6) and outlet (7) for a sample to be analyzed and diagnosed, according to the embodiment of the present invention, and a photograph thereof.

The sample which can be analyzed or diagnosed using the inventive microfluidic circuit element includes any inorganic or organic sample, preferably, a biological sample such as blood, body fluid, urine or saliva. Thus, the microfluidic circuit element can be used in various applications for analysis or diagnosis of a sample and can be applied to various diagnostic kits for various diseases, e.g., a biosensor, a DNA analysis chip, a protein analysis chip and lab-on-a-chip.

The inclusion of nano interstices into the sidewalls of the microfluidic channel (main channel), according to the embodiments of the invention, imposes a strong driving force on the flow in the main channel. See, FIG. 5A and FIG. 5B. Even without nano interstices, hydrophilic surface treatments may help generate a capillary flow in channels formed using hard plastics, such as polycarbonate (PC), polystyrene (PS), and polymethylmethacrylate (PMMA). However the acquired hydrophilicity gradually disappears over several months after fabrication, and the plastic channel surface restores to its original sub-hydrophobic contact angle. The nano interstices-integrated microfluidic element according to the embodiments of the invention has solved this problem and the nano interstices-driven microflow effectively drives liquid filling in a variety of plastic microfluidic products with sub-hydrophobic surface contact angles, thereby ensuring robust flow generation, regardless of the storage time (See, FIG. 5B).

As described above, the inventive microfluidic channel is fabricated to have nano interstices at both sides thereof, in which a fluid can easily infiltrate by capillary force. The fluid having infiltrated the nano interstices makes it easy to load the channel to enhance the fluid transfer therethrough. Thus, the nano interstices improve the surface wettability. Also, a stable flow of the fluid can be achieved even without any surface treatment of the channel for reducing the contact angle which tends to deform after long-term used or storage.

EXAMPLE

The following examples are intended to illustrate the present invention, however these examples are not to be construed to limit the scope of the invention.

Example 1. Fabrication of Microfluidic Circuit Element Using Inventive Joining Process A plastic microfluidic device capable of two substrates was fabricated of PMMA (poly(methylmethacrylate)) by injection molding. Referring to FIGS. 2A and 3A, a groove (3) which would function as a channel having a rectangular cross sectional shape (a width of 4 mm, a height of 0.1 mm and a length of 40 mm) equipped with an inlet and an outlet was formed in an upper substrate (1), while a 1 mm thick lower substrate (2) having a flat surface was prepared.

The substrates (1 and 2) thus prepared by injection molding were washed with a detergent, sonicated with deionized water, dried in an oven at 60° C. overnight, and then subjected to oxygen plasma treatment for 2 min using a plasma cleaning system (available from Jesagi Hankook Ltd., Korea.)

Subsequently, the treated substrates (1 and 2) were subjected to solvent-joining to form a microfluidic channel (5) having nano interstices (4) formed therein. That is, the substrates (1 and 2) were compressed together to form an assembly having a minute space layer therebetween.

Figure 2B:
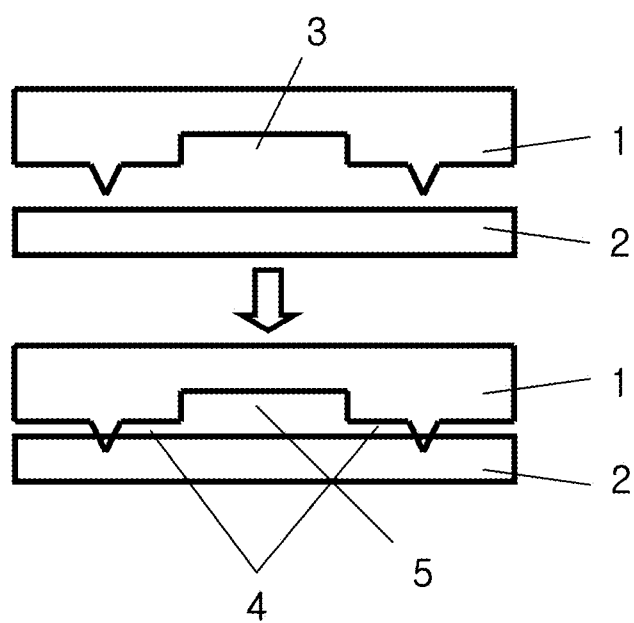
FIG. 2B: a schematic view of the cross-section of a microfluidic channel according to an embodiment of the present invention and a process of forming nano interstices joined by ultrasonic radiation according to the present invention.
Figure 2C:
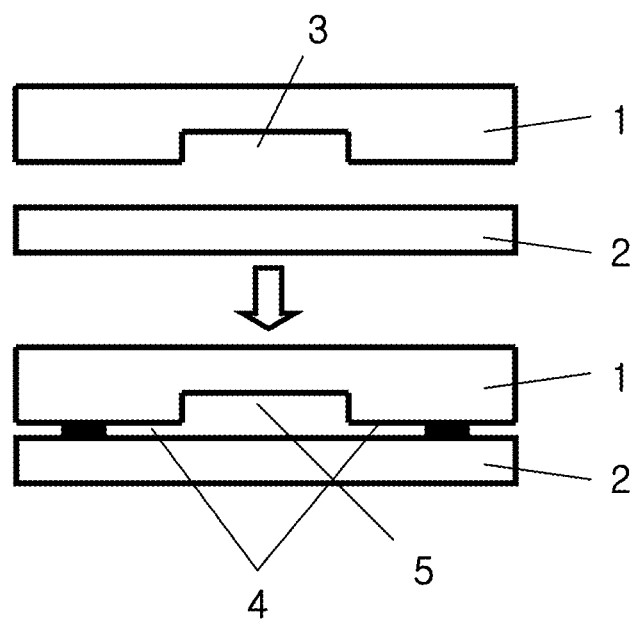
FIG. 2C: a schematic view of the cross-section of a microfluidic channel according to an embodiment of the present invention and a process of forming nano interstices joined using an adhesive or tape according to the present invention.
Figure 2D:
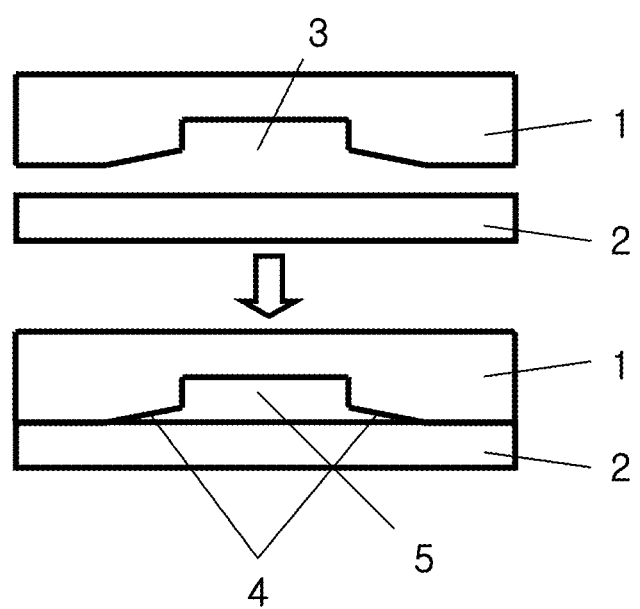
FIGS. 2D, 2E, 2F, and 2G: schematic views of the cross-section of various modifications of the nano interstices according to the present invention.
Figure 2E:
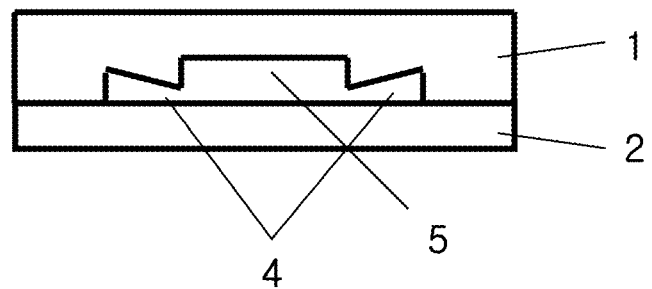
Figure 2F:
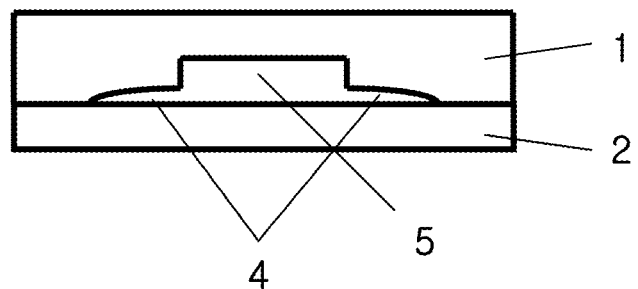
Figure 2G:
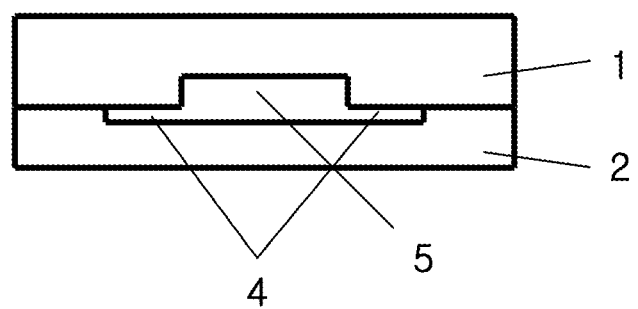
Figure 2H:
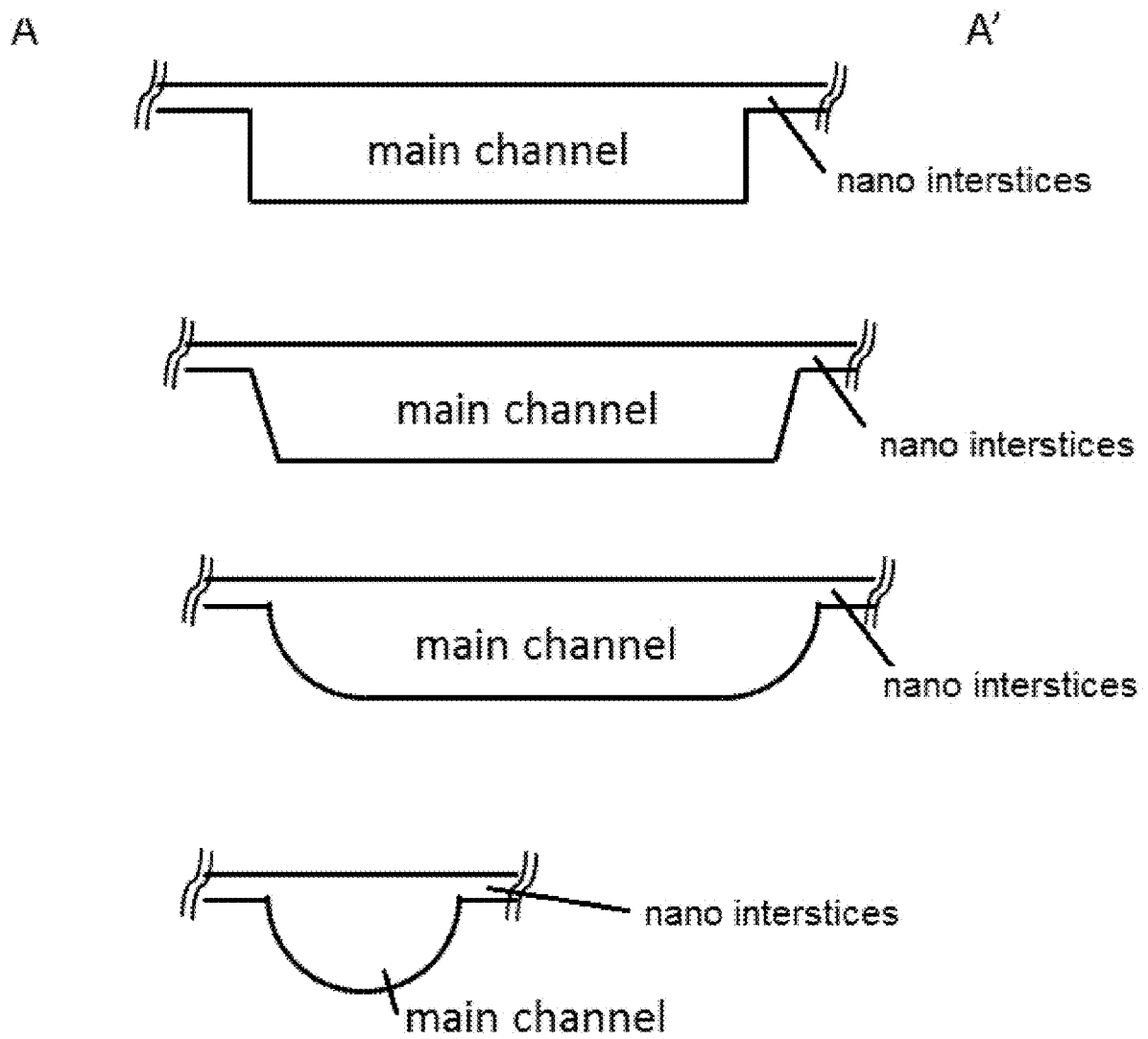
FIG. 2H: a schematic view of the cross-section of main channels viewed along the dotted line A-A' of FIG. 6 of a microfluidic channel according to an embodiment of the present invention.

The assembly thus attained was treated with acetone injected at around the joint section as shown in the FIGS. 2A and 2B to allow the injected acetone infiltrate and dissolve a part of the interface along the length of the substrates, to join the substrates together. The applied pressure was released within 10 seconds so that the inside regions of the space between the substrates remain unjoined to form nano interstices (4) at both sides of the microfluidic channel (5) (FIG. 3A.)

Similarly, by following the substantially the same procedure (see, FIG. 7A), a microfluidic channel (FIGS. 8A, 8B, and 8C) having a center main channel (6), two side nano interstices (4) with a pit structure (40), two side channels (20), and a bonding layer (10) was manufactured.

The height of the interstices was controlled by adjusting the amount and the duration of applying pressure after the solvent injection.

If the application time is reduced, the height of the nano interstices becomes higher. In the present example, the pressure-application time required to fabricate the element having the nano interstices was seven seconds. The width of the nano interstice (4) was determined by subtracting the infiltrated solvent width of about 200 μm from the initial channel wall width of 1 mm, as shown in FIG. 3A. The depth of the solvent infiltration is not dependent on the pressure-application time or the amount of solvent used, but it depends primarily on the rate at which the solvent dissolves the plastic.

The solvent joining procedure of the present example can maintain the height of the formed channel unchanged over a long-period of use. In fact, the height of the microfluidic channel (5) was measured every month over 1 year in accordance with Guidelines for Quality Assurance, and the height of the microfluidic channel (5) among 100 samples selected every month fell within 98-102 μm.

Example 2

Figure 9A:
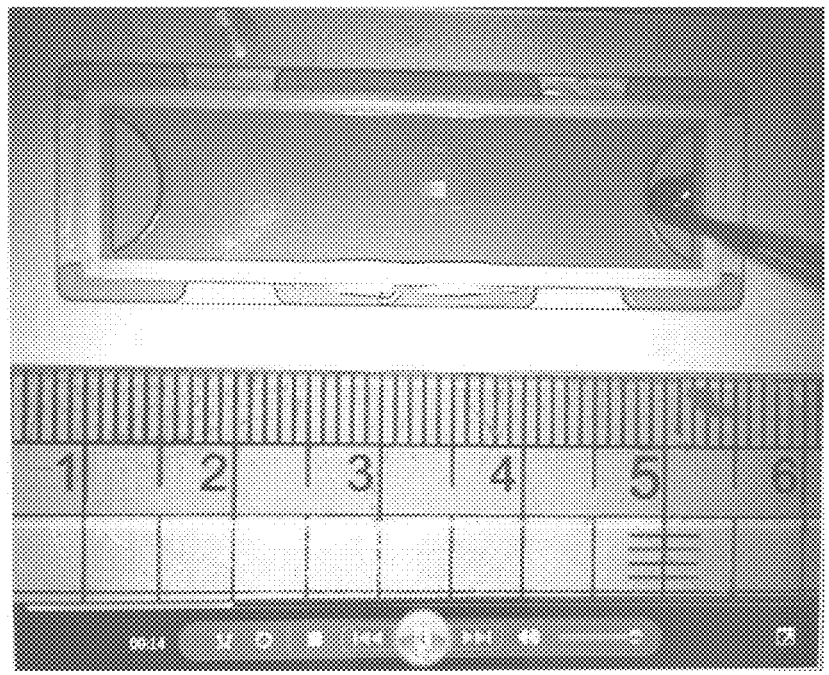
FIGS. 9A and 9B are footages at 14 seconds and 21 seconds of a video image showing the flow of an ink-containing fluid sample introduced into the device according to Example 2.
Figure 9B:
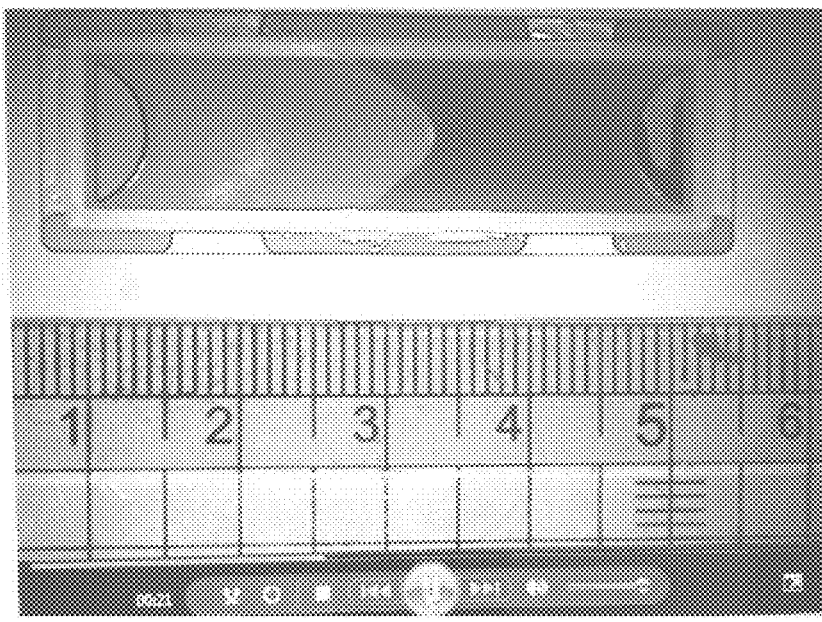

By following the same procedure using the solvent joining procedure of Example 1, a microfludic element of which the main channel has 10 mm width and 20 μm height, and nano interstices have a width of 1.3 mm and a height of 2 μm was manufactured. When a red ink fluid was introduced into the inlet, the fluid moves into the nano interstices first and then filled in the main channel, as shown in FIG. 9A and FIG. 9B.

It was noted that it would not be possible to fill a fluid into a same main channel, but lacking the nano interstices, because of a high fluid resistance caused by the small dimension of the height of 20 μm, which is only ⅕ of the height of the convention devices.

Figure 3B:
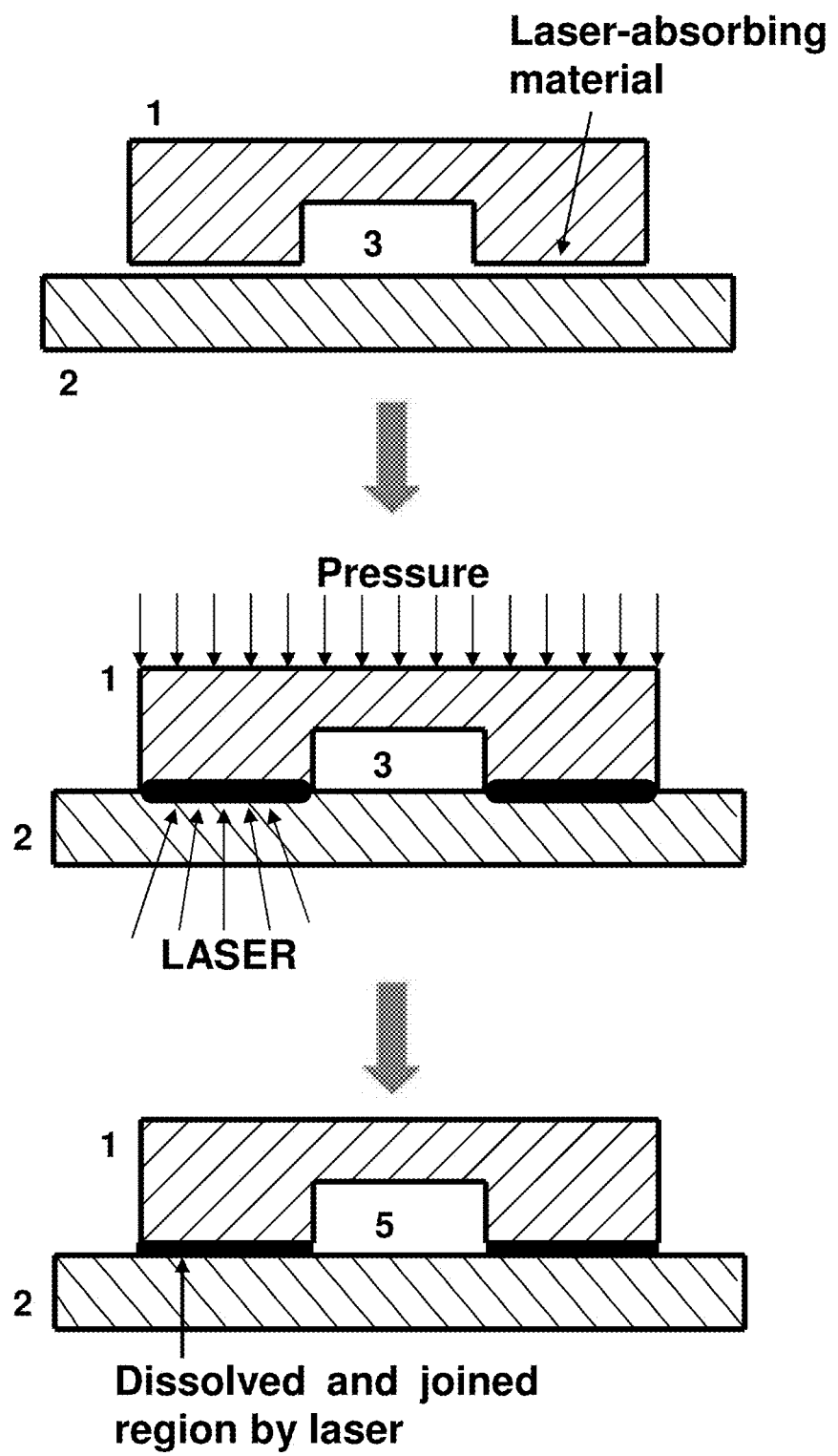
FIG. 3B: a process of forming a channel having no nano interstices by using laser-joining.

Comparative Example 1. Fabrication of Microfluidic Circuit Element Using Typical Joining Process A microfluidic circuit element was formed in the same manner as in Example 1, with the exception that the entire contact surfaces of the upper and lower substrates (1 and 2) were joined using a typical laser joining process (FIG. 3B.)

Figure 4A:
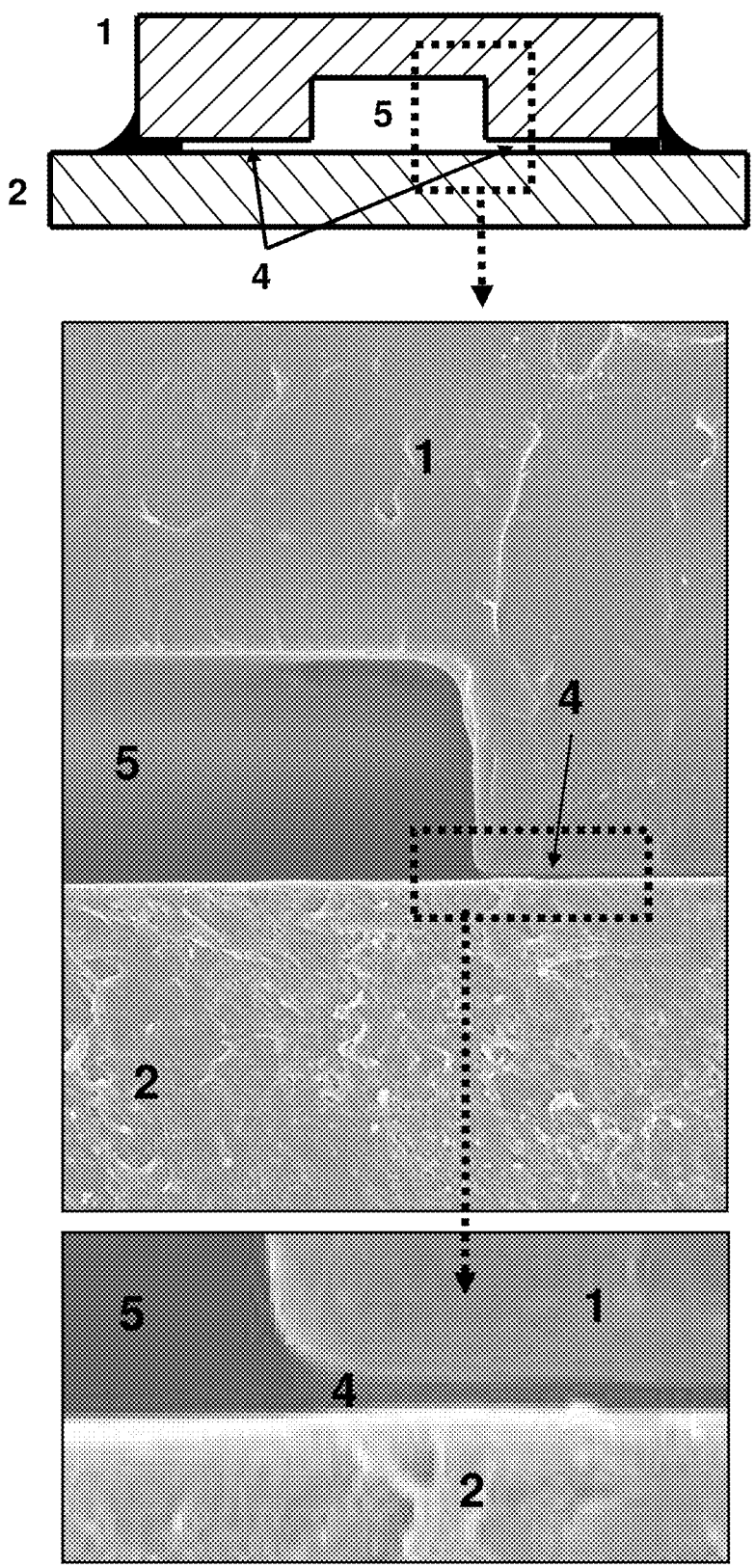
FIG. 4A: a cross-section at view of the microfluidic channel having nano interstices formed using a solvent according to the present invention, and SEM images corresponding thereto.
Figure 4B:
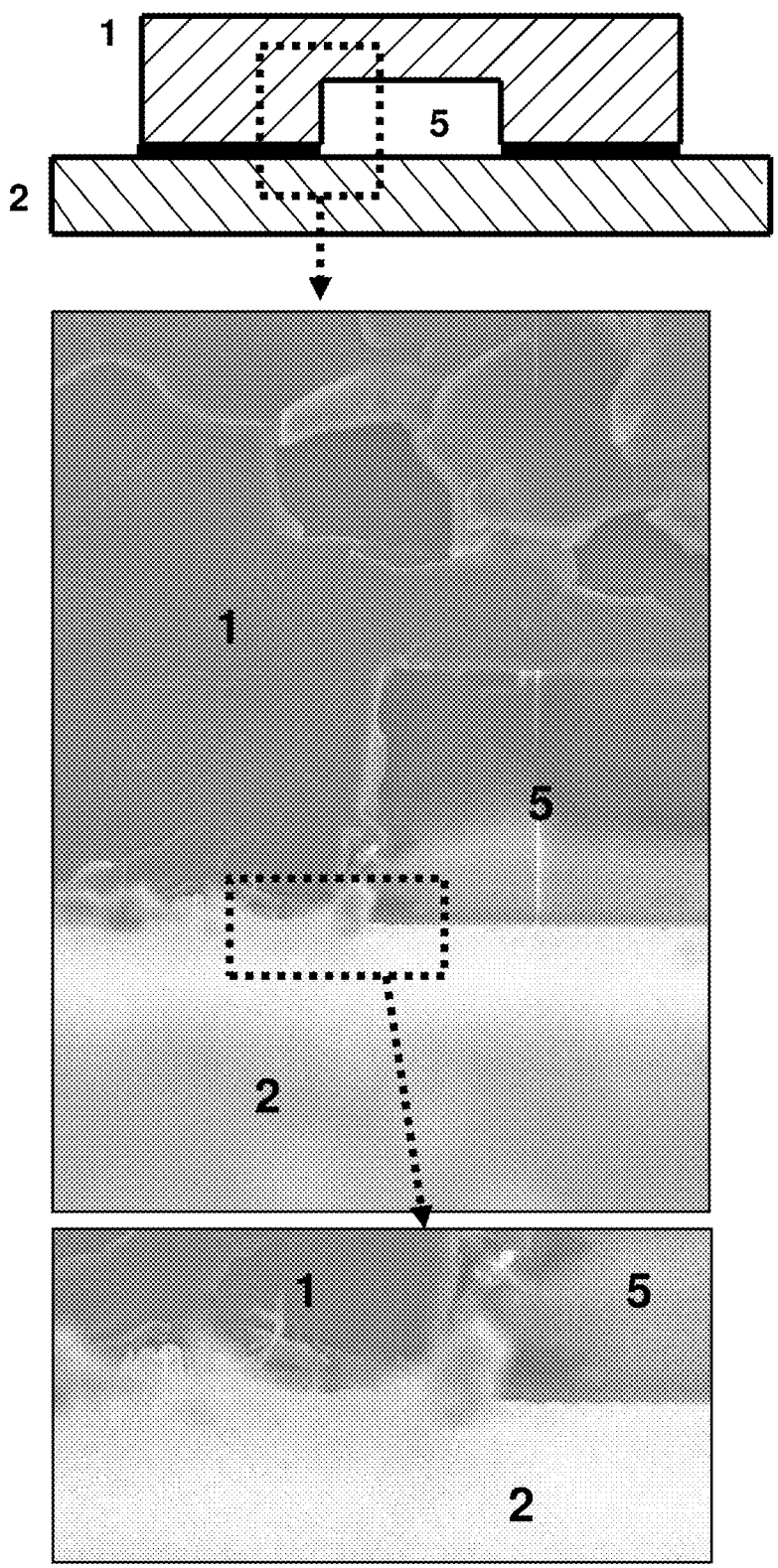
FIG. 4B: a cross-section at view of a microfluidic channel having no nano interstices formed by laser-joining, and SEM images corresponding thereto.

To compare the microfluidic circuit elements of Example 1 and Comparative Example 1, SEM images thereof are shown in FIGS. 4A and 4B. As shown in FIGS. 4A and 4B, the microfluidic channel (5) of Example 1 had nano interstices (4) formed at both sides thereof defined inside the peripheral joined region, whereas the microfluidic channel (5) of Comparative Example 1 had no nano interstices.

Test 1. Evaluation of Flow Stability of Fluid

The flow of the fluid in the microfluidic channel was measured shortly after fabrication and after being stored for one year in a plastic bag, by measuring the degree of displacement (s–s0) of the air in the interface with water in the microfluidic channel using deionized water containing a food color.

20 µl of deionized water containing a food color was introduced to the inlet of the element, the flow image thereof was photographed with a digital camera and the length of the water plug in the channel in the captured image was measured with a ruler. The results are shown in FIGS. 5A and 5B, which respectively represent the case having no nano interstices and the inventive case having nano interstices.

Figure 5A:
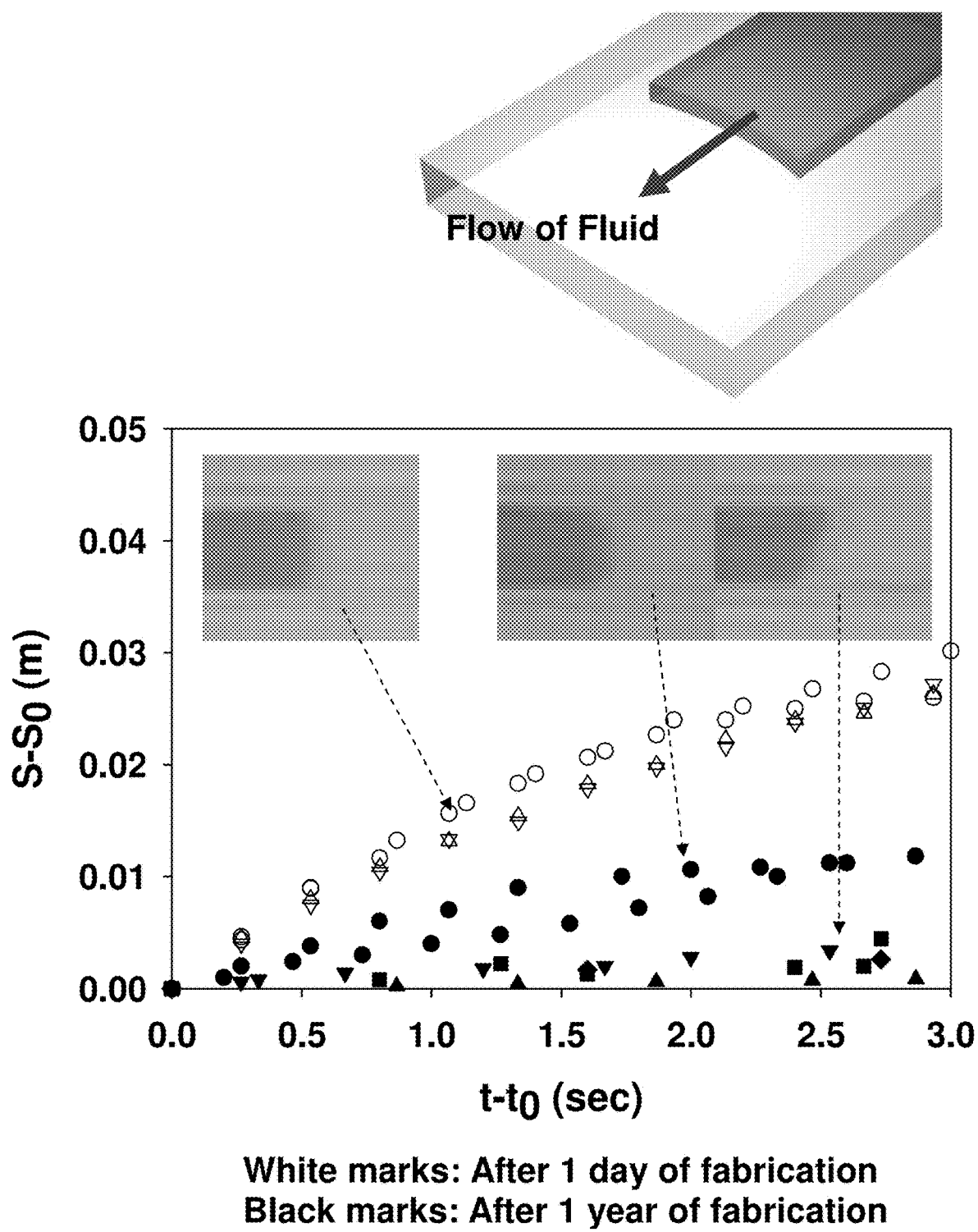
FIG. 5A: the fluid flowability through the microfluidic channel having no nano interstices formed by laser-joining.
Figure 5B:
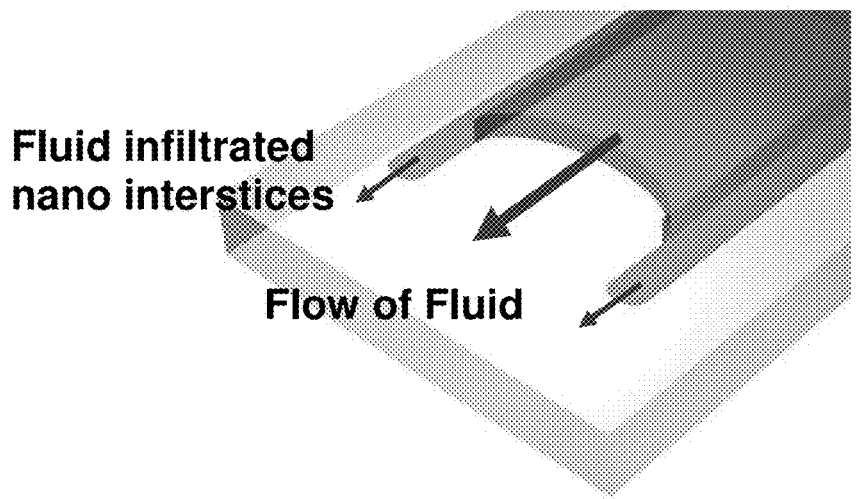
FIG. 5B: the fluid flowability through the microfluidic channel having the nano interstices according to the present invention.
Figure 5B:
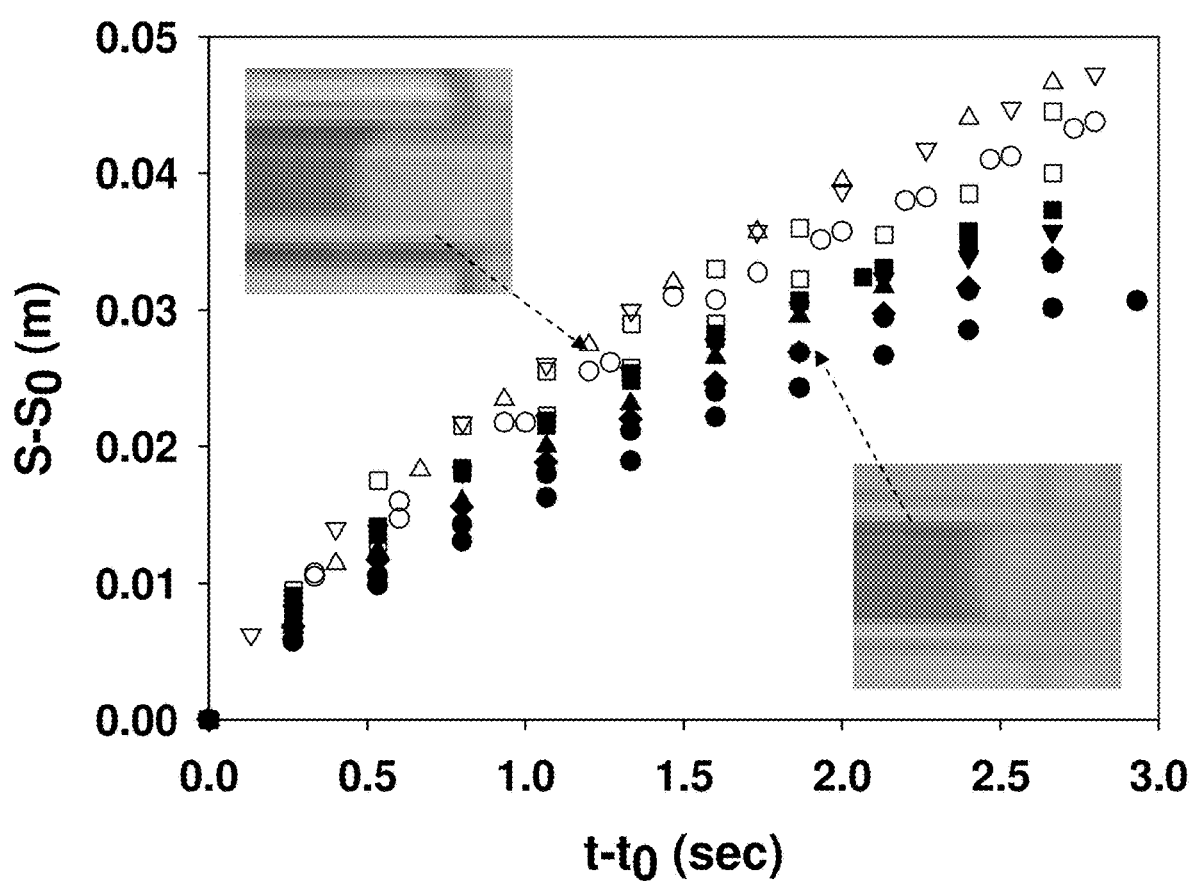

Referring to FIG. 5A, a stable flow of the fluid shortly after fabrication is shown (white marks.) However, after being stored for one year (black marks), almost no flow is observable. Whereas, referring to FIG. 5B, a stable flow was observed both shortly after fabrication (white marks) and after being stored for one year (black marks.) Also, the rate of the stable flow observed in the latter case was higher than that observed for the case in which the channel was not equipped with nano interstices, regardless whether the rate was measured shortly after fabrication or after being stored for one year.

While the invention has been described with respect to the above specific embodiments, it should be recognized that various modifications and changes may be made to the invention by those skilled in the art which also fall within the scope of the invention as defined by the appended claims.

What is claimed is:

1. A method for fabricating a microfluidic circuit element, comprising
    bringing a first plastic substrate plate into contact with a second plastic substrate plate, wherein at least one of the first plastic substrate plate and the second plastic substrate plate comprises a main channel, a nano interstice and a peripheral region on their facing surface, the nano interstice extends along an entire length of both sides of the main channel, lateral with respect to a longitudinal axis of the main channel, the peripheral region encloses the nano interstice, the nano interstice in its entire length is in fluid communication with the main channel, and the main channel has an inlet and an outlet connecting the first and second ends of the main channel to an outside of the microfluidic circuit element, for a liquid sample to flow therethrough; and
    (i) applying a bonding agent only to the peripheral region of the facing surface of the first and second plastic substrate plates prior to the step of brining the first plastic substrate plate into contact with the second plastic substrate plate, or (ii) injecting the bonding agent into through holes provided at the peripheral region subsequent to the step of brining the first plastic substrate plate into contact with the second plastic substrate plate,
    wherein the main channel has a height of 5 µm-2 mm, and a width of 100 µm-20 mm, and an aspect ratio of the width to the height is 10-2000,
    wherein a height of the nano interstice ranges from 100 nm to 5 µm and a width of the nano interstice ranges from 100 µm to 3 mm, and
    wherein the height of the main channel is greater than the height of the nano interstice, and the width of the nano interstice is smaller than the width of the main channel.

2. The method of claim 1, wherein the bonding agent is a solvent or an adhesive.

\* \* \* \* \*